(12) United States Patent
Nishida

(10) Patent No.: US 7,153,710 B2
(45) Date of Patent: Dec. 26, 2006

(54) ETCHING METHOD, METHOD OF MANUFACTURING SEMICONDUCTOR DEVICE, AND SEMICONDUCTOR DEVICE

(75) Inventor: Tomoya Nishida, Kagoshima (JP)

(73) Assignee: Sony Corporation, Tokyo (JP)

( * ) Notice: Subject to any disclaimer, the term of this patent is extended or adjusted under 35 U.S.C. 154(b) by 8 days.

(21) Appl. No.: 10/996,013

(22) Filed: Nov. 23, 2004

(65) Prior Publication Data

US 2005/0118818 A1    Jun. 2, 2005

(30) Foreign Application Priority Data

Dec. 2, 2003    (JP) .................... P2003-403599

(51) Int. Cl.
*H01L 21/00*    (2006.01)
(52) U.S. Cl. .................... 438/8; 438/689; 438/714; 438/735; 438/737; 437/738
(58) Field of Classification Search ................ 257/368, 257/E21.214; 438/689, 714, 735, 737, 738, 438/213, 194, 8; 216/103
See application file for complete search history.

(56) References Cited

U.S. PATENT DOCUMENTS

| | | | | | |
|---|---|---|---|---|---|
| 5,041,393 | A | * | 8/1991 | Ahrens et al. | 438/172 |
| 5,419,808 | A | * | 5/1995 | Kitano | 438/745 |
| 5,756,403 | A | * | 5/1998 | Tijburg et al. | 438/745 |
| 6,004,881 | A | * | 12/1999 | Bozada et al. | 438/705 |
| 6,232,139 | B1 | * | 5/2001 | Casalnuovo et al. | 438/48 |
| 2003/0155619 | A1 | * | 8/2003 | Imoto | 257/369 |

* cited by examiner

*Primary Examiner*—George R. Fourson
*Assistant Examiner*—John M. Parker
(74) *Attorney, Agent, or Firm*—Sonnenschein Nath & Rosenthal LLP

(57) ABSTRACT

In an etching method, an etching amount is controlled on the basis of the number of times an etching process is performed under the condition that an etching amount is determined independently of an etching time. Accordingly, the etching can be performed in step-by-step manner, whereby enabling the control of the etching amount at high precision.

7 Claims, 3 Drawing Sheets

ETCHING METHOD, METHOD OF MANUFACTURING SEMICONDUCTOR DEVICE, AND SEMICONDUCTOR DEVICE

CROSS REFERENCE TO RELATED APPLICATIONS

The present invention claims priority to its priority document No. 2003-403599 filed in the Japanese Patent Office on Dec. 2, 2003, the entire contents of which being incorporated by reference herein.

BACKGROUND OF THE INVENTION

1. Field of the Invention

The present invention relates to an etching method, a method of manufacturing a semiconductor device, and a semiconductor device.

2. Description of Related Art

In a semiconductor process, a processing technique for etching a material film formed on a substrate is necessary.

The etching technique may be roughly classified into two kinds: a wet etching which uses a chemical solution including an acid as an etching solution (etchant); and a dry etching which uses various gases. Moreover, as for the wet etching, a dipping method which dips the substrate, such as a wafer or the like, into the etchant, and a spinning method which drops the chemical solution into the substrate and carries out the etching while rotating the substrate, and the like are known. Furthermore, as the etchant for a semi-insulating GaAs substrate used for a field effect transistor, which will be described later, and the like, the mixed solution of organic acid, such as phosphoric acid, citric acid and the like, hydrogen peroxide and water is typically used.

When the wet etching is used to etch a substrate, its etching amount typically depends on an etching time. That is, the dipping method tries to obtain a predetermined etching amount by dipping the substrate into the etchant for a predetermined time.

As one of the semiconductor processes which use the above-mentioned wet etching, there is a method of manufacturing a semiconductor device, which is designed to form a plurality of transistors having different threshold voltages on the same semiconductor substrate (for example, see Japanese Patent Application Publication 2002-100641).

When the plurality of transistors are assumed to be a depletion type field effect transistor (hereafter, referred to as D-FET and an enhancement type field effect transistor (hereafter, referred to as E-FET), in which threshold voltages are different from each other, their configurations are simply explained.

FIG. 6 shows an example of IC in which the D-FET and the E-FET are formed on the same substrate. By the way, for the purpose of explanation, it is explained under the assumption that the E-FET is arranged on the right side of each drawing and the D-FET is arranged on the left side thereof.

In FIG. 6, a numeral 100 indicates a semi-insulating GaAs substrate. A buffer layer 110, a channel layer 120 and a barrier layer 130 are formed thereon in order of mention by epitaxial growth. The barrier layer 130 is constructed from: a spacer layer 131 made of undoped AlGaAs; an electron supplying layer 132 made of AlGaAs in which, for example, n-type impurity is doped; and a gate contact layer 133 made of undoped AlGaAs. A first buried gate region 141 to which, for example, p-type impurity is added at a high concentration (the E-FET side) and a second buried gate region 142 (the D-FET side) are formed in this gate contact layer 133, respectively. By the way, a numeral 150 indicates an insulating film, numerals 161, 171 indicate a source electrode and a drain electrode on the E-FET side, numerals 162, 172 indicate a source electrode and a drain electrode on the D-FET side, and numerals 181, 182 indicate gate electrodes on the E-FET side and the D-FET, respectively.

Here, it is known that the respective threshold voltages of the E-FET and the D-FET are determined from the distances between the respective buried gate regions 141, 142 and the electron supplying layer 132.

The buried gate region 142 immediately under the gate electrode 182 on the D-FET side is formed such that, for example, the portion on the insulating film 150 is used as mask, and the p-type impurity is selectively diffused from its gate opening 152. Next, the depth from the surface thereof is controlled so as to exhibit any threshold voltage.

On the other hand, the first buried gate region 141 located immediately under the gate electrode 181 on the E-FET side is formed such that as for the gate contact layer 133 exposed to the gate opening 151 formed in the insulating film 150, as shown in FIG. 7, after a resist 190 is formed on the surface, for example, the above-mentioned wet etching is used to selectively carry out the etching and reduce the layer thickness, and, simultaneously with the formation of the second buried gate region 142 on the D-FET side, the p-type impurity is selectively diffused. That is, the thickness of the gate contact layer 133 on which the first buried gate region 141 is formed is adjusted so as to obtain a predetermined threshold voltage when the p-type impurity having the same depth as the D-FET side is diffused.

SUMMARY OF THE INVENTION

However, when the D-FET and the E-FET are formed together on the same substrate by the above-mentioned process, it is often difficult to control the threshold voltage of the E-FET.

That is, as mentioned above, as for the gate section of the E-FET, before the formation of the first buried gate region 141, through the gate opening 151 preliminarily opened in the insulating film 150, the layer needs to be thinned by carrying out the wet etching, which dips the gate contact layer 133 into the etching solution. However, the precision of the etching amount is the order of ± several nm.

However, in the method which depends on the etching amount as mentioned above, it is difficult to control the etching amount at the high precision as mentioned above. As a result, in actual processes, the threshold voltage cannot be controlled with stability in many cases, which leads to decrease in the yield of manufactured ICs.

In this way, in the related art, the etching method of controlling the etching amount on the basis of the etching time has its limitation. Furthermore, by using the above-mentioned technique, for example, it is also difficult to set the threshold voltage of the field effect transistor. Thus, as mentioned above, in the etching method of the related art in which the etching amount depends on the etching time, it is difficult to monolithically form the transistors whose threshold voltages are different, on the same semiconductor substrate. Consequently, it is often difficult to attain the performance improvement and manufacture stabilization of a communication MMIC (Monolithic Microwave IC) in which the above-mentioned technique is used to form a plurality of function circuits, such as a power amplifier, a switch and the like, in the same chip.

The present invention addresses the above-identified, and other problems associated with techniques of the related art.

In a first embodiment of the present invention, there is provided an etching method that controls an etching amount on the basis of the number of times an etching process is performed, under the condition that an amount of the etching is determined independently of an etching time.

In a second embodiment of the present invention, there is provided an etching method that uses an etching solution including a mixed solution of hydrogen peroxide, citric acid, ammonia and propanol, for an AlGaAs layer, and controls an etching amount on the basis of the number of times the etching process is performed independently of an etching time.

According to a third embodiment of the present invention, there is provided a method of manufacturing a semiconductor device, including the steps of: etching a first formation region on which a first field effect transistor is formed in a semiconductor substrate; forming a predetermined step-like structure between the first formation region and a second formation region on which a second field effect transistor is formed; and forming a first buried gate region and a second buried gate region in respective predetermined positions of the first and second formation regions on the semiconductor substrate while maintaining the step-like structure by respectively performing a vapor diffusion process with an impurity at the same time or substantially the same time; whereby forming a first field effect transistor and a second field effect transistor whose threshold voltages are different from each other. Furthermore, in the present embodiment, the method is adapted to control the etching amount based on the number of times an etching process is performed when the first formation region is etched, under the condition that an etching amount is determined independently of an etching time.

According to a fourth embodiment of the present invention, there is provided a semiconductor device including a first field effect transistor and a second field effect transistor whose threshold voltages are different from each other, the first and second field effect transistors being formed in a semiconductor substrate. Furthermore, in the semiconductor device of the present embodiment, a predetermined step-like structure is formed between a first formation region on which the first field effect transistor is formed and a second formation region on which the second field effect transistor is formed by etching the first formation region for a predetermined amount, an amount of which is determined on the basis of the number of times an etching process is performed, under the condition that the etching amount is determined independently of an etching time.

(1) According to the first embodiment, since the etching amount is controlled on the basis of the number of times the etching process is performed under the condition that the etching amount is determined independently of the etching time, the etching can be performed in step-by-step manner, whereby enabling the control of the etching amount at the high precision. Accordingly, for example, on the same substrate, the step-like structure with a predetermined amount may be easily formed at a plurality of positions.

(2) In the second embodiment, the etching solution including the mixed solution of hydrogen peroxide, citric acid, ammonia and propanol is used for the AlGaAs layer, and the etching amount is controlled on the basis of the number of times an etching process is performed independently of the etching time. Accordingly, the etching amount of the AlGaAs layer may be controlled at the high precision without using any special etching solution, (3) In the third embodiment, the method of manufacturing a semiconductor device includes the steps of: etching a first formation region on which a first field effect transistor is formed in a semiconductor substrate; forming a predetermined step-like structure between the first formation region and a second formation region on which a second field effect transistor is formed; and forming a first buried gate region and a second buried gate region in respective predetermined positions of the first and second formation regions on the semiconductor substrate while maintaining the step-like structure by respectively performing a vapor diffusion process with an impurity at the same time or substantially the same time; whereby forming a first field effect transistor and a second field effect transistor whose threshold voltages are different from each other. Furthermore, in the present embodiment, the method is adapted to control the etching amount based on the number of times an etching process is performed when the first formation region is etched, under the condition that an etching amount is determined independently of an etching time. Accordingly, the threshold voltage of the first field effect transistor, which is determined by a difference from the threshold voltage of the second field effect transistor, may be controlled on the basis of the etching amount. As a result, a desired threshold voltage can be accurately obtained, thereby improving the product yield. In particular, if the first field effect transistor is an enhancement type field effect transistor and the second field effect transistor is a depletion type field effect transistor, the stabilization of device productivity and its reliability can be improved for manufacturing of MMICs, which are ICs for high frequency and the like.

(4) In the fourth embodiment, the semiconductor device includes a first field effect transistor and a second field effect transistor whose threshold voltages are different from each other, the first and second field effect transistors being formed in a semiconductor substrate. Furthermore, in the semiconductor device of the present embodiment, a predetermined step-like structure is formed between a first formation region on which the first field effect transistor is formed and a second formation region on which the second field effect transistor is formed by etching the first formation region for a predetermined amount, which is determined on the basis of the number of times an etching process is performed, under the condition that an etching amount is determined independently of an etching time. Accordingly, the threshold voltage of the first field effect transistor, which is determined by a difference from the threshold voltage of the second field effect transistor, may be controlled on the basis of the etching amount. As a result, a desired threshold voltage can be accurately obtained, thereby improving the product yield. In particular, if the first field effect transistor is an enhancement type field effect transistor and the second field effect transistor is a depletion type field effect transistor, the stabilization of device productivity and its reliability can be improved for manufacturing of MMICs, which are ICs for high frequency and the like.

BRIEF DESCRIPTION OF DRAWINGS

The above and other objects, features and advantages of the present invention will become more apparent from the following description of the presently preferred exemplary embodiment of the invention taken in conjunction with the accompanying drawings, in which.

DETAILED DESCRIPTION OF EMBODIMENTS

An etching method according to an embodiment of the present invention is designed so as to control an etching amount on the basis of the number of times an etching process is performed, under the condition that the etching amount is determined independently of an etching time.

More specifically, in a dipping type wet etching which uses a chemical solution including an organic acid as an etching solution and then dips a substrate into this etching solution and in which the control of the etching amount is determined by an etching time in the related art, the etching amount can be controlled on the basis of the number of times an etching process is performed. Accordingly, since the etching amount in single etching process is quantified, a step-by-step execution of the etching is realized and the etching amount can be controlled with high precision. For example, a plurality of step-like structures of desired amounts may be formed within the same substrate.

The condition of that the etching amount is determined independently of the etching time, for example, may be achieved by using an etching solution whose etching ability for a predetermined substrate is close to a saturation point.

In the method according to the present embodiment, the etching solution including the mixed solution of hydrogen peroxide, citric acid, ammonia and propanol is used for an AlGaAs layer. This solution is usually used for a GaAs layer. It was experimentally confirmed that when this etching solution is used to carry out the etching, although the etching amount was changed on the basis of the etching time for the GaAs layer, the etching amount can be controlled on the basis of the number of times the etching process is performed and is independent of the etching time for the AlGaAs layer.

In other words, it is found that, when the etching is performed on the AlGaAs layer by using the etching solution including the mixed solution of hydrogen peroxide, citric acid, ammonia and propanol, the etching amount becomes constant once it reaches to a predetermined amount even if the etching time is extended.

Figure 1:
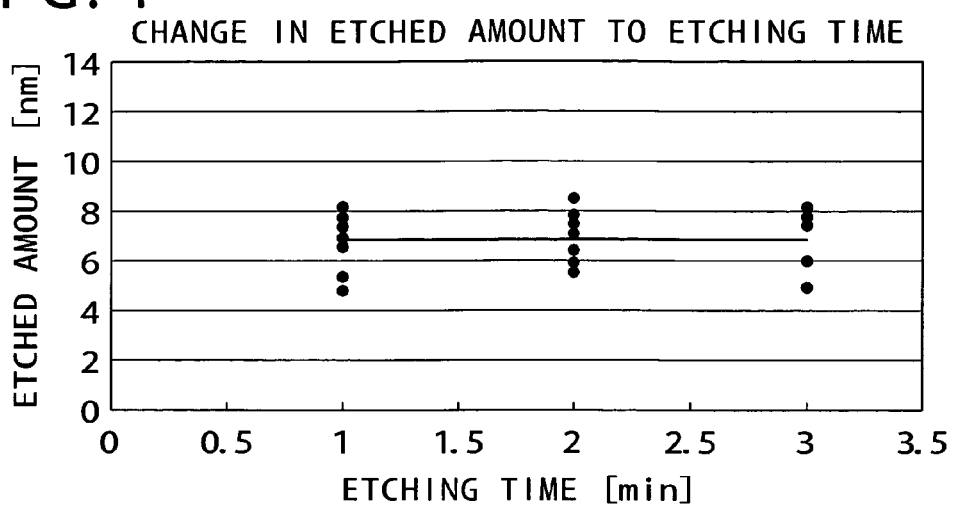
FIG. 1 is a graph showing a relation between an etching time and an etching amount in an etching method according to an embodiment of the present invention.

FIG. 1 is a graph illustrating a change of the etching amount (cut amount) with respect to the etching time, when the etching solution described above is used to etch an AlGaAs layer.

As shown in FIG. 1, in the etching method according to the present embodiment, the etching amount does not depend on the etching time. Such a property enables to control the etching amount of the AlGaAs layer at the high precision by using an etching solution of related art, without using any special etching solution.

As to a relation between the etching amount (cut amount) and a mixing ratio of hydrogen peroxide to the mixed solution of citric acid, ammonia and propanol in the etching solution, it was experimentally found that as the mixing ratio of hydrogen peroxide decreases, the etching amount for single etching process increases, and as the mixing ratio increases, the etching amount for single etching process decreases. Accordingly, the etching amount for single etching process according to this etching method can be properly set by changing the mixing ratio of hydrogen peroxide to the mixed solution of citric acid, ammonia and propanol.

The above-mentioned etching method is applicable to a case in which a first field effect transistor and a second field effect transistor whose threshold voltages are different from each other are formed on the same semiconductor substrate.

In other words, on the same semiconductor substrate, a first formation region on which the first field effect transistor is formed is etched, and a predetermined step-like structure is formed between the first formation region and a second formation region on which the second field effect transistor is formed. Next, while the step-like structure is maintained, impurity is vapor-diffused into predetermined positions of the first and second formation regions, respectively, at the same time or substantially the same time, whereby forming a first buried gate region and a second buried gate region.

Next, if the first field effect transistor is an enhancement type field effect transistor (E-FET) and the second field effect transistor is a deletion type field effect transistor (D-FET), the present etching method is preferable when a MMIC that is an IC for high frequency or the like is manufactured.

Furthermore, the semiconductor substrate used in the present embodiment may be a substrate with a multi-layer in which a buffer layer made of undoped GaAs, a channel layer made of undoped GaAs and a barrier layer made of AlGaAs are sequentially formed on a semi-insulating GaAs substrate in order of mention by an epitaxial growth. Furthermore, the barrier layer may include: a spacer layer made of undoped AlGaAs; an electron supplying layer made of AlGaAs, for example, in which an n-type impurity is doped; and a gate contact layer made of undoped AlGaAs. Accordingly, a formation region of E-FET in the gate contact layer made of the undoped AlGaAs, which is the top layer of this multi-layer structure, becomes a layer to be etched.

Accordingly, the threshold voltage of the E-FET that is the first field effect transistor is determined by a difference from the threshold voltage of the D-FET, and the difference is controlled on the basis of the etching amount of the gate contact layer made of undoped AlGaAs. In the present embodiment, the etching amount is controlled on the basis of the number of times the etching process is performed independently of the etching time. Accordingly, a desired threshold voltage can be accurately obtained, thereby improving the performance as well as improving the product yield.

A table 1 shows one example of experimental results illustrating a relation between the number of times the etching process is performed to an AlGaAs layer by using the above-mentioned etching solution and a change in the etching amount (cut amount).

TABLE 1

| Number of Times Etching Process is Performed | One Time | Two Times | Three Times |
| --- | --- | --- | --- |
| Average Cut Amount | 6.6 mm | 12.5 mm | 18.5 mm |

As can be understood from the table 1, the use of the etching method according to the present embodiment enables the etching amount (cut amount) to be controlled on the basis of the number of times the etching process is performed, and enables to obtain step-by-step differences between the threshold voltage of the E-FET and the threshold voltage of the D-FET. The threshold voltage difference between the E-FET and the D-FET can be obtained correspondingly to the cut amount in single etching process. As the etching is performed two or three times, the threshold voltage differences equal to approximately two or three times that of single etching process can be obtained. Accordingly, by controlling the respective threshold voltages of the E-FET and D-FET in accordance with the etching amount of the gate contact layer, it is possible to control the etching and obtain a desired value at high precision.

Figure 2A:
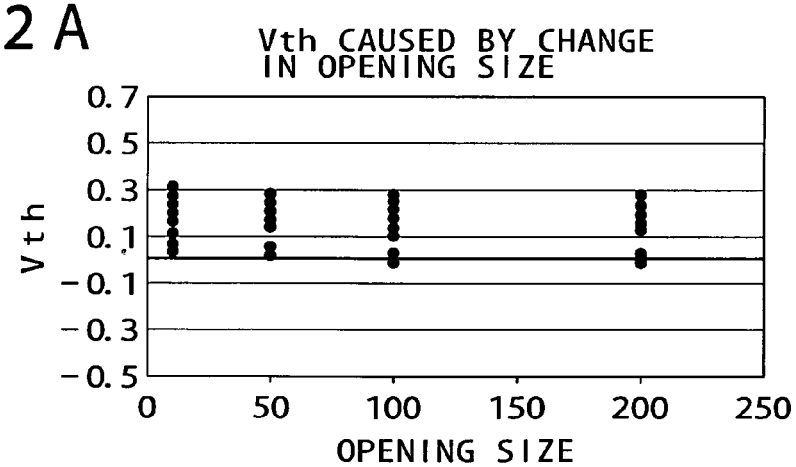
FIGS. 2A, 2B are graphs showing dependencies on an opening size and a distance between adjacent openings in the same etching method.
Figure 2B:
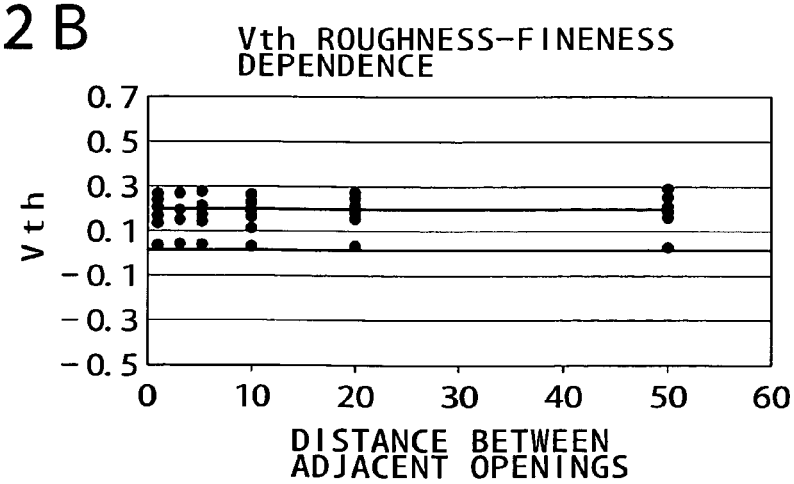

Furthermore, as shown in FIG. 2, in the etching method according to the present embodiment, the threshold voltage does not depend on an opening size nor a distance between adjacent openings to be etched.

Accordingly, in setting the threshold voltage of the E-FET, it is possible to control the threshold voltage at the high precision, independently of the opening size, which becomes the etching region in the gate contact layer, and the closeness of the adjacent openings.

Figure 3:
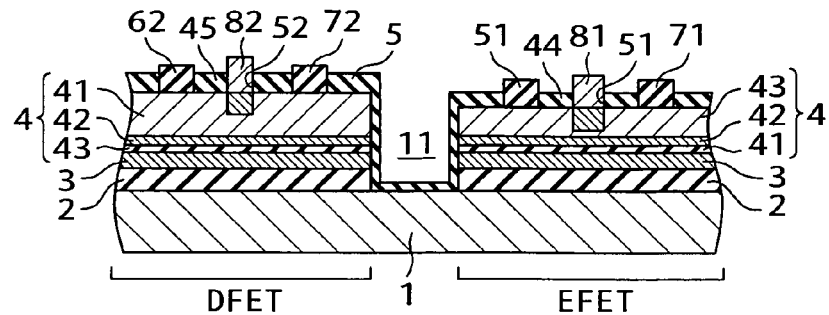
FIG. 3 is an explanation view of a semiconductor device according to an embodiment of the present invention.

Below, as embodiments of the present invention, a semiconductor device in which the first field effect transistor and the second field effect transistor whose threshold voltages are different from each other are formed on the same semiconductor substrate and a method of manufacturing the same are explained with an example of a junction high electron mobility transistor (JHEMT), as a field effect transistor, designed to obtain higher performance by employing a p-type buried gate structure among high electron mobility transistors (HEMT) that become the main stream for devices of the MMIC is explained with reference to FIGS. 3 to 5. In FIGS. 3 to 5, the explanation is made with assumption that the E-FET is placed on the right side of each drawing and the D-FET is placed on the left side thereof, for the purpose of simplicity.

FIG. 3 shows an example structure of the semiconductor device according to the present embodiment. As shown in FIG. 3, in the semiconductor device, a barrier layer 4 made of AlGaAs, a channel layer 3 made of undoped GaAs, a buffer layer 2 made of undoped GaAs are sequentially formed on a semi-insulating GaAs substrate 1 on which an element separation region 11 is formed by an epitaxial growth. The composition of Al in AlGaAs in the present embodiment is 0.2.

The barrier layer 4 is constructed from a spacer layer 41 made of undoped AlGaAs, an electron supplying layer 42 made of AlGaAs in which an n-type impurity is doped, and a gate contact layer 43 made of undoped AlGaAs. A first buried gate region 44 (on the E-FET side) to which a p-type impurity is doped at a high concentration and a second buried gate region 45 (on the D-FET side) are formed inside the gate contact layer 43, respectively. A numeral 5 indicates an insulating film formed on the barrier layer 4.

Si (silicon) is used as the n-type impurity which is doped in the electron supplying layer 42, and Zn (zinc) is used as the p-type impurity which is doped in the buried gate region 44 (the E-FET side) and the second buried gate region 45 (the D-FET side).

Furthermore, numerals 61, 71 indicate a source electrode and a drain electrode on the E-FET side, and numerals 62, 72 indicate a source electrode and a drain electrode on the D-FET side. They are formed by opening parts of the insulating film 5, and directly evaporating electrode materials on the gate contact layer 43 by means of an evaporating method, and further performing a heat treatment. In other words, the respective source electrodes 61, 62 and drain electrodes 71, 72 on the E-FET and D-FET sides are joined to the gate contact layer 43, respectively.

Furthermore, numerals 81, 82 indicate respective gate electrodes on the E-FET and D-FET sides, and they are joined to the first and second buried gate regions 44, 45 inside the gate contact layer 43 to which the p-type impurity is added at a high concentration, through gate openings 51, 52 formed in the insulating film 5, respectively.

The second buried gate region 45 located immediately under the gate electrode 82 on the D-FET side is formed by selectively diffusing the p-type impurity only into the gate opening 52 formed in advance using the insulating film 5 as a mask.

On the other hand, the first buried gate region 44 located immediately under the gate electrode 81 on the E-FET side is also formed by selectively diffusing the p-type impurity through the gate opening 51 formed in advance in the insulating film 5. However, at this time, in the gate contact layer 43 made of the undoped AlGaAs on the E-FET side, the portion immediately under the gate electrode 81 is wet-etched in advance for a predetermined amount, and the film thickness is consequently reduced.

Accordingly, the threshold voltages of the D-FET and E-FET as mentioned above are determined by the distance between the electron supplying layer 42 and the lower sides of the respective buried gate regions 44, 45. If the threshold voltage of the D-FET is defined as a reference, the difference between the threshold voltages of the D-FET and E-FET is determined by the etching amount obtained by etching of the gate contact layer 43 on which the E-FET is formed.

Below, with reference to FIGS. 4A to 4C and FIGS. 5A, 5B, the etching method of the gate contact layer 43 is described, and a manufacturing process for a semiconductor device having the above-mentioned configuration is described.

Figure 4A:
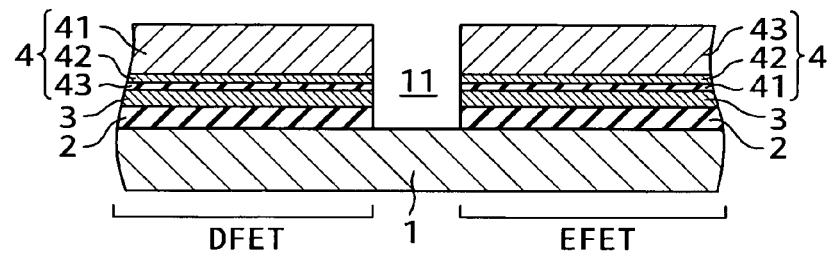
FIGS. 4A to 4C are explanation views showing a part of a manufacturing process of a semiconductor device according to an embodiment of the present invention.

At first, as shown in FIG. 4A, the buffer layer 2 made of the undoped GaAs, the channel layer 3 made of the undoped GaAs, and the barrier layer 4 made of the AlGaAs in which the spacer layer 41, the electron supplying layer 42 and the gate contact layer 43 are formed as mentioned above are sequentially formed by an epitaxial growth on the semi-insulating GaAs substrate 1. In order to separate device elements, the epitaxially-grown portions except the regions on which the D-FET, the E-FET and the other elements are formed are etched and removed by using a predetermined etching solution including, for example, phosphoric acid and hydrogen peroxide.

Figure 4B:
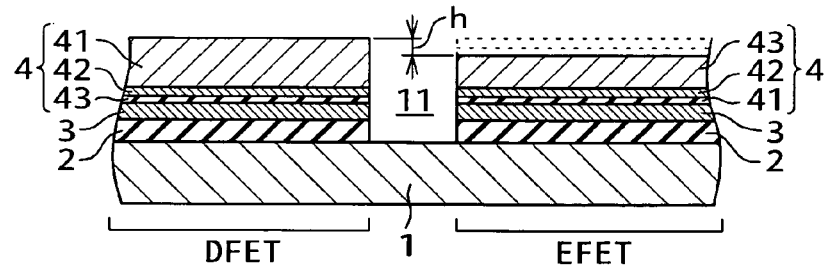

Next, as shown in FIG. 4B, in the gate contact layer 43 of the barrier layer 4 made of the AlGaAs, the substrate surface including the first formation region to form the E-FET is dipped into the etching solution including hydrogen peroxide and a mixed solution of citric acid, ammonia and propanol for a certain time period. Next, the E-FET formation region is etched to form a step h between the substrate surfaces of the E-FET formation region and the D-FET formation region.

In the present embodiment, the etching amount is constant and independent of dipping time period when the surface of the AlGaAs layer is dipped into the etching solution. Thus, in order to obtain a desired etching amount, namely, the step h, it is sufficient to repeat the etching for the predetermined number of times corresponding to the desired amount. In the instant example, the etching is performed two times.

In this way, when the surface of the AlGaAs layer is etched, under the condition that the etching amount is determined independently of the etching time, the etching amount is controlled on the basis of the number of times the etching process is performed. Thus, the several threshold voltage differences between the D-FET and the E-FET can be obtained on the substrate with single specification.

Figure 4C:
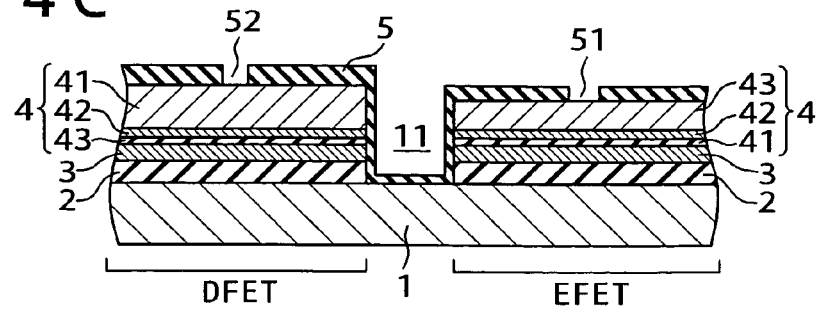

Next, as shown in FIG. 4C, silicon nitride (SiN) that serves as the insulating film 5 is deposited on the substrate surface, for example, by a CVD (Chemical Vapor Deposition) method. Moreover, together with the first formation region for the E-FET and the second formation region for the D-FET, the insulating film 5 in the region to form the gate section is removed, for example, by patterning a resist mask and using an RIE (Reactive Ion Etching) technique. Consequently, the gate openings 51, 52 are formed.

Figure 5A:
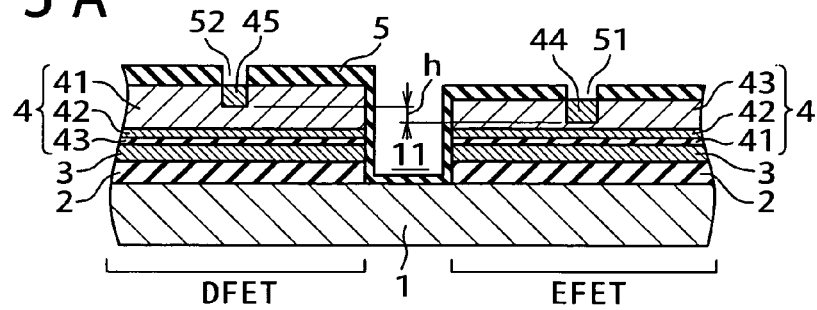
FIGS. 5A, 5B are explanation views showing a part of a manufacturing process for a semiconductor device according to an embodiment of the present invention.

Next, as shown in FIG. 5A, a vapor phase diffusing method is used to diffuse zinc (Zn), which is the p-type impurity, through the gate openings 51, 52 into the gate contact layer 43 and consequently form the first buried gate region 44 and the second buried gate region 45. In the present embodiment, as shown in FIG. 5A, between the D-FET side and the E-FET side, the diffusion depth appears as the difference corresponding to the amount (step h) when the gate contact layer 43 is etched in the previous process.

Figure 5B:
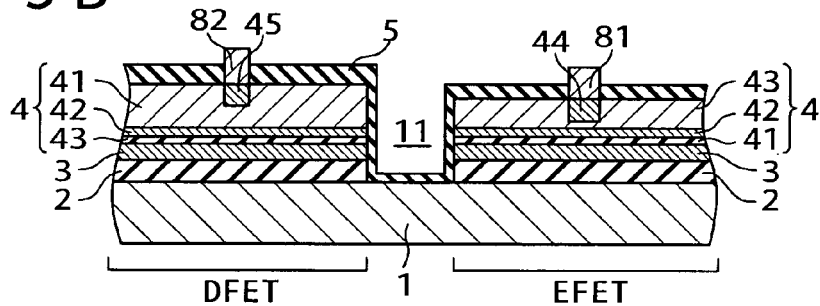
Figure 6:
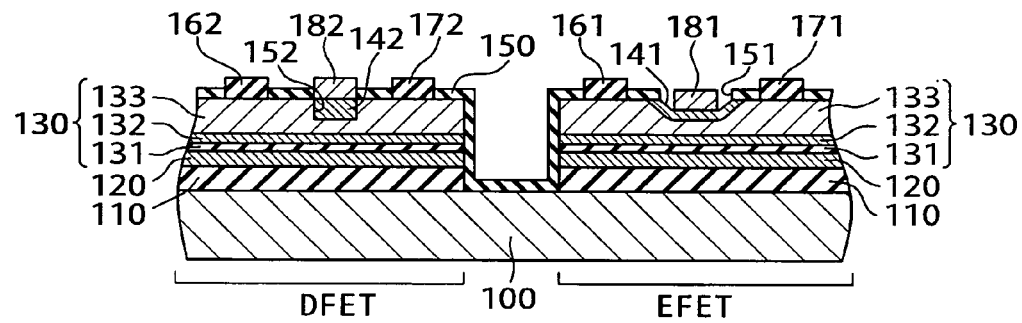
FIG. 6 is an explanation view showing a part of a manufacturing process for a semiconductor device of related art.
Figure 7:
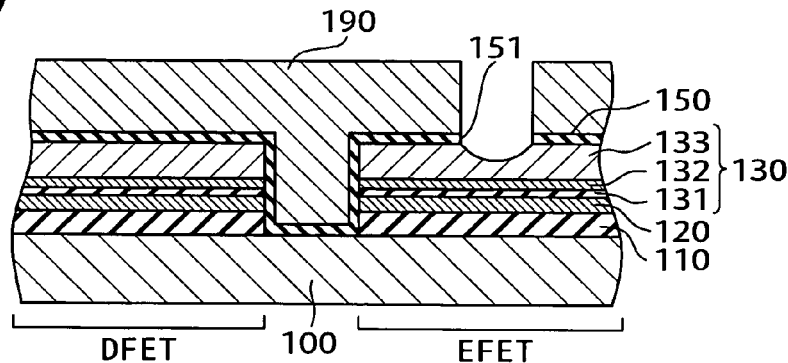
FIG. 7 is an explanation view showing an etching method in a manufacturing process of a semiconductor device of related art.

Next, as shown in FIG. 5B, for example, titanium (Ti), platinum (Pt) and gold (Au) are sequentially evaporated, and the pattern is formed, thereby forming the gate electrode 81 on the E-FET side and the gate electrode 82 on the D-FET side.

Next, in the first formation region and the second formation region, some of the insulating film 5 are removed and opened, respectively, and so as to be joined through those openings to the gate contact layer 43, the source electrode 61 and drain electrode 71 on the E-FET side and the source electrode 62 and drain electrode 72 on the D-FET side are formed, thereby obtaining the semiconductor device having the structure shown in FIG. 3.

As explained above, in the method of manufacturing the semiconductor device according to the present embodiment, when the threshold voltage of the E-FET is determined, as for the threshold voltage of this E-FET, the difference from the threshold voltage of the D-FET may be controlled on the basis of the etching amount. Accordingly, the desired threshold voltage can be accurately obtained, thereby enabling stable manufacturing and improvement of product yield. Furthermore, even in case of manufacturing MMICs or the like in which the technique for forming the above-mentioned D-FET and E-FET on the same substrate is used, it is possible to stabilize the productivity and improve the reliability of devices.

It should be understood by those skilled in the art that various modifications, combinations, sub-combinations and alterations may occur depending on design requirements and other factors insofar as they are within the scope of the appended claims or the equivalents thereof.

What is claimed is:

1. A method of etching a semiconductor device comprising the steps of:
    etching a semiconductor device; and
    controlling an etching amount by repeating the etching of the device a number of times, wherein the etching amount is controlled independently of etching time.

2. A method of etching a semiconductor device comprising the steps of:
    etching a semiconductor device; and
    controlling an etching amount by repeating the etching of the device a number of times, wherein the etching amount is controlled independently of etching time, and
    wherein an etching solution including a mixed solution of hydrogen peroxide, citric acid, ammonia and propanol is used during the etching.

3. The method of etching a semiconductor device according to claim 2 wherein:
    the etching amount in single etching process is controlled by a mixture ratio of the hydrogen peroxide.

4. A method of etching a compound semiconductor device comprising the steps of:
    etching a compound semiconductor device; and
    controlling an etching amount by repeating the etching of the device a number of times, wherein the etching amount is controlled independently of etching time, and
    wherein an etching solution including a mixed solution of hydrogen peroxide, citric acid, ammonia and propanol is used for etching the compound semiconductor device.

5. The method of etching a compound semiconductor device according to claim 4, wherein:
    the compound semiconductor is AlGaAs.

6. The method of etching a compound semiconductor device according to claim 4 or claim 5, wherein:
    the etching amount in single etching process is controlled by a mixture ratio of the hydrogen peroxide.

7. A method of manufacturing a semiconductor device, comprising the steps of:
    etching a first formation region on which a first field effect transistor is formed in a semiconductor substrate;
    forming a predetermined step-like structure between the first formation region and a second formation region on which a second field effect transistor is formed; and
    forming a first buried gate region and a second buried gate region in respective predetermined positions of the first and second formation region on the semiconductor substrate while maintaining the step-like structure by respectively performing a vapor diffusion process with an impurity at the same time or substantially the same time;
    forming the first field effect transistor and the second field effect transistor whose threshold voltages are different from each other,
    wherein an etching amount is controlled based on the number of times an etching process is performed when the first formation region is etched and the etching amount is determined independently of an etching time.

* * * * *